(12) United States Patent
We et al.

(10) Patent No.: US 9,875,997 B2
(45) Date of Patent: Jan. 23, 2018

(54) LOW PROFILE REINFORCED PACKAGE-ON-PACKAGE SEMICONDUCTOR DEVICE

(71) Applicant: QUALCOMM Incorporated, San Diego, CA (US)

(72) Inventors: Hong Bok We, San Diego, CA (US); Dong Wook Kim, San Diego, CA (US); Kyu-Pyung Hwang, San Diego, CA (US); Young Kyu Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 40 days.

(21) Appl. No.: 14/572,753

(22) Filed: Dec. 16, 2014

(65) Prior Publication Data

US 2016/0172344 A1    Jun. 16, 2016

(51) Int. Cl.
*H01L 25/10* (2006.01)
*H01L 23/14* (2006.01)
(Continued)

(52) U.S. Cl.
CPC ............ *H01L 25/105* (2013.01); *H01L 24/19* (2013.01); *H01L 24/20* (2013.01); *H01L 25/50* (2013.01);
(Continued)

(58) Field of Classification Search
CPC ....... H01L 25/0657; H01L 2924/15311; H01L 25/105; H01L 24/05; H01L 24/81;
(Continued)

(56) References Cited

U.S. PATENT DOCUMENTS 5,534,356 A * 7/1996 Mahulikar ............ H01L 23/142
    205/105
7,429,501 B1 9/2008 Wu et al.
(Continued)

OTHER PUBLICATIONS

International Search Report and Written Opinion—PCT/US2015/065757—ISA/EPO—Apr. 19, 2016.

*Primary Examiner* — Daniel Luke
*Assistant Examiner* — Khatib Rahman
(74) *Attorney, Agent, or Firm* — Muncy, Geissler, Olds & Lowe, P.C.

(57) ABSTRACT

The present disclosure provides semiconductor packages and methods for fabricating PoP semiconductor packages. The PoP semiconductor package may comprise a first semiconductor package, the first semiconductor package comprising an anodized metal lid structure comprising (i) a central cavity having a central cavity opening direction and (ii) at least one perimeter cavity having a perimeter cavity opening direction facing in an opposite direction of the central cavity opening direction, a first semiconductor device arranged in the central cavity of the anodized metal lid structure, a redistribution layer electrically coupled to the first semiconductor device, wherein a conductive trace formed in the redistribution layer is exposed to the at least one perimeter cavity, and solder material arranged in the at least one perimeter cavity, and a second semiconductor package, the second semiconductor package comprising at least one conductive post, wherein the at least one conductive post is electrically coupled to the solder material arranged in the at least one perimeter cavity.

23 Claims, 7 Drawing Sheets

(51) Int. Cl.
*H01L 25/00* (2006.01)
*H01L 23/13* (2006.01)
*H01L 23/538* (2006.01)
*H01L 23/00* (2006.01)
*H01L 23/31* (2006.01)

(52) U.S. Cl.
CPC ............ *H01L 23/13* (2013.01); *H01L 23/142* (2013.01); *H01L 23/3128* (2013.01); *H01L 23/5389* (2013.01); *H01L 23/562* (2013.01); *H01L 24/29* (2013.01); *H01L 24/32* (2013.01); *H01L 24/73* (2013.01); *H01L 24/83* (2013.01); *H01L 24/92* (2013.01); *H01L 2224/04105* (2013.01); *H01L 2224/12105* (2013.01); *H01L 2224/24247* (2013.01); *H01L 2224/2919* (2013.01); *H01L 2224/32245* (2013.01); *H01L 2224/73267* (2013.01); *H01L 2224/8203* (2013.01); *H01L 2224/83192* (2013.01); *H01L 2224/92244* (2013.01); *H01L 2225/1035* (2013.01); *H01L 2225/1058* (2013.01); *H01L 2225/1088* (2013.01); *H01L 2924/15153* (2013.01); *H01L 2924/15155* (2013.01); *H01L 2924/15311* (2013.01); *H01L 2924/15724* (2013.01); *H01L 2924/15747* (2013.01); *H01L 2924/3511* (2013.01)

(58) Field of Classification Search
CPC ........... H01L 23/04; H01L 2224/81201; H01L 2224/02333; H01L 2224/81359; H01L 2225/1088; H01L 2924/15724; H01L 2225/1058; H01L 2924/15153; H01L 2924/3511
See application file for complete search history.

(56) References Cited

U.S. PATENT DOCUMENTS

| | | | |
|---|---|---|---|
| 7,642,656 B2 | 1/2010 | Yoo et al. | |
| 7,868,440 B2 * | 1/2011 | Roberts | ............... H01L 23/3121 257/686 |
| 7,999,359 B2 | 8/2011 | Wu | |
| 8,299,595 B2 | 10/2012 | Yoon et al. | |
| 8,642,393 B1 * | 2/2014 | Yu | ........................... H01L 25/50 257/678 |
| 8,963,311 B2 * | 2/2015 | Zhao | ............................. 257/686 |
| 2006/0255449 A1 | 11/2006 | Lee et al. | |
| 2007/0074900 A1 | 4/2007 | Lee et al. | |
| 2008/0164597 A1 | 7/2008 | Hsu et al. | |
| 2009/0115045 A1 * | 5/2009 | Hsu | ........................ H05K 1/144 257/686 |
| 2009/0321915 A1 * | 12/2009 | Hu | ...................... H01L 23/5389 257/690 |
| 2010/0078788 A1 * | 4/2010 | Wagiman | .......... H01L 23/49811 257/686 |
| 2010/0155920 A1 | 6/2010 | Lee | |
| 2011/0164391 A1 | 7/2011 | Shin et al. | |
| 2012/0129298 A1 | 5/2012 | Lin et al. | |
| 2013/0168856 A1 * | 7/2013 | Wang | .................... H01L 25/105 257/738 |
| 2014/0070396 A1 | 3/2014 | Kyozuka et al. | |

* cited by examiner

LOW PROFILE REINFORCED PACKAGE-ON-PACKAGE SEMICONDUCTOR DEVICE

INTRODUCTION

Aspects of this disclosure relate generally to semiconductor devices, and more particularly to enhancing the density and facilitating the fabrication of semiconductor devices having a package-on-package (PoP) semiconductor device structure.

Package-on-package (PoP) semiconductor devices have been developed for applications such as cellular telephones and other portable devices in which circuit board space must be conserved. In one possible scenario, the bottom package is a processor package and the top package is a memory package. PoP technology has certain benefits relative to other technologies, such as a stacked-die circuit. For example, a manufacturer can lower costs and increase flexibility by substituting different memory packages in a PoP structure, as opposed to being tied to a particular memory. Moreover, the top and bottom packages of a PoP structure may be tested independently. By contrast, if a bad die is included in a stacked-die structure, the entire structure must be rejected.

FIG. 1 illustrates a typical PoP semiconductor device 100. A circuit board 110 is coupled to a first package 130. As shown in FIG. 1, the first package 130 is a bottom package. In particular, the circuit board 110 comprises circuit board contacts 112, and solder balls 120 couple the circuit board 110 to the first package 130. The first package 130 comprises a first substrate 140 and a first semiconductor device 150. The first semiconductor device 150 may be embedded in a first mold 152. In one possible scenario, the first semiconductor device 150 is a processor. The first package 130 is coupled to a second package 170 via solder balls 160. The solder balls 160 couple contacts on a surface of the first package 130 (not shown) to contacts on a surface of the second package 170 (not shown). The second package 170 comprises a second substrate 180 and a second semiconductor device 190. The second semiconductor device 190 may be embedded in a second mold 192.

Improved PoP semiconductor device designs face two key technological challenges. First, the overall height of the PoP semiconductor device must be reduced so that the device profile is smaller. Second, as the components of the PoP semiconductor device become thinner, they become more difficult to fabricate. The first substrate 140 shown in FIG. 1, for example, may exhibit an increased tendency to warp during fabrication. As a result, new materials, designs, and processes are needed to prevent warping of thin components during fabrication.

Accordingly, there is a need in the art for improved PoP architectures that provide increased density and ease of fabrication.

SUMMARY

In one aspect, the present disclosure provides a PoP semiconductor package comprising a first semiconductor package, the first semiconductor package comprising an anodized metal lid structure comprising (i) a central cavity having a central cavity opening direction and (ii) at least one perimeter cavity having a perimeter cavity opening direction facing in an opposite direction of the central cavity opening direction, a first semiconductor device arranged in the central cavity of the anodized metal lid structure, a redistribution layer electrically coupled to the first semiconductor device, wherein a conductive trace formed in the redistribution layer is exposed to the at least one perimeter cavity, and solder material arranged in the at least one perimeter cavity, and a second semiconductor package, the second semiconductor package comprising at least one conductive post, wherein the at least one conductive post is electrically coupled to the solder material arranged in the at least one perimeter cavity.

In another aspect, the present disclosure provides a method of fabricating a PoP semiconductor package comprising forming an anodized metal lid structure, wherein forming the anodized metal lid structure comprises defining a central cavity having a central cavity opening direction in the anodized metal lid structure and defining at least one perimeter cavity having a perimeter cavity opening direction in the anodized metal lid structure, wherein the perimeter cavity opening direction faces in an opposite direction of the central cavity opening direction, placing a first semiconductor device in the central cavity of the anodized metal lid structure, forming a first semiconductor package by electrically coupling the first semiconductor device to a redistribution layer, wherein a conductive trace formed in the redistribution layer is exposed to the at least one perimeter cavity, filling at least a portion of the at least one perimeter cavity with a solder material, and attaching a second semiconductor package having at least one conductive post to the first semiconductor package by coupling the at least one conductive post to the solder material.

In yet another aspect, the present disclosure provide a PoP semiconductor device, comprising a first semiconductor package, the first semiconductor package comprising means for electrically isolating and protecting the first semiconductor package, having a first opening and having a second opening facing in an opposite direction of the first opening, a first semiconductor device arranged in the first opening of the means for electrically isolating and protecting a first semiconductor device, means for redistributing electrical signals coupled to the first semiconductor device, wherein the means for redistributing electrical signals is exposed to the second opening, and first means for coupling arranged in the second opening and a second semiconductor package, the second semiconductor package comprising second means for coupling, wherein the second means for coupling is electrically coupled to the first means for coupling arranged in the means for transferring charge.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the invention, and in which.

DETAILED DESCRIPTION

Aspects of the disclosure are disclosed in the following description and related drawings directed to specific aspects of the disclosure. Alternate aspects may be devised without departing from the scope of the invention. Additionally, well-known elements of the invention will not be described in detail or will be omitted so as not to obscure the relevant details of the invention.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the invention" does not require that all aspects of the invention include the discussed feature, advantage or mode of operation.

As used herein, the term "vertical" is generally defined with respect to a surface of a substrate or carrier upon which a semiconductor package is formed. The substrate or carrier will generally define a "horizontal" plane, and a vertical direction approximates a direction that is roughly orthogonal to the horizontal plane.

To address some of the deficiencies of conventional PoP semiconductor package designs, the overall height of the PoP semiconductor device must be reduced so that the device profile is smaller. Moreover, new materials, designs, and processes are needed to prevent warping of thin components during fabrication. The present disclosure presents various arrangements of components in a PoP semiconductor package. The present disclosure also presents various methods for fabricating the PoP semiconductor package.

In conventional designs, the solder balls placed between the first package and the second package (e.g. the solder balls 160 shown in FIG. 1) tend to increase the overall height of the PoP semiconductor package. In one aspect of the present disclosure, a first package and second package are coupled to one another without the use of solder balls, thus reducing the overall height of the PoP semiconductor package. Conventional designs also utilize substrates (e.g., the first substrate 140 shown in FIG. 1) that have a tendency to warp as they become thinner. In another aspect of the present disclosure, a conventional substrate is omitted in favor of a warp-resistant design.

Figure 2:
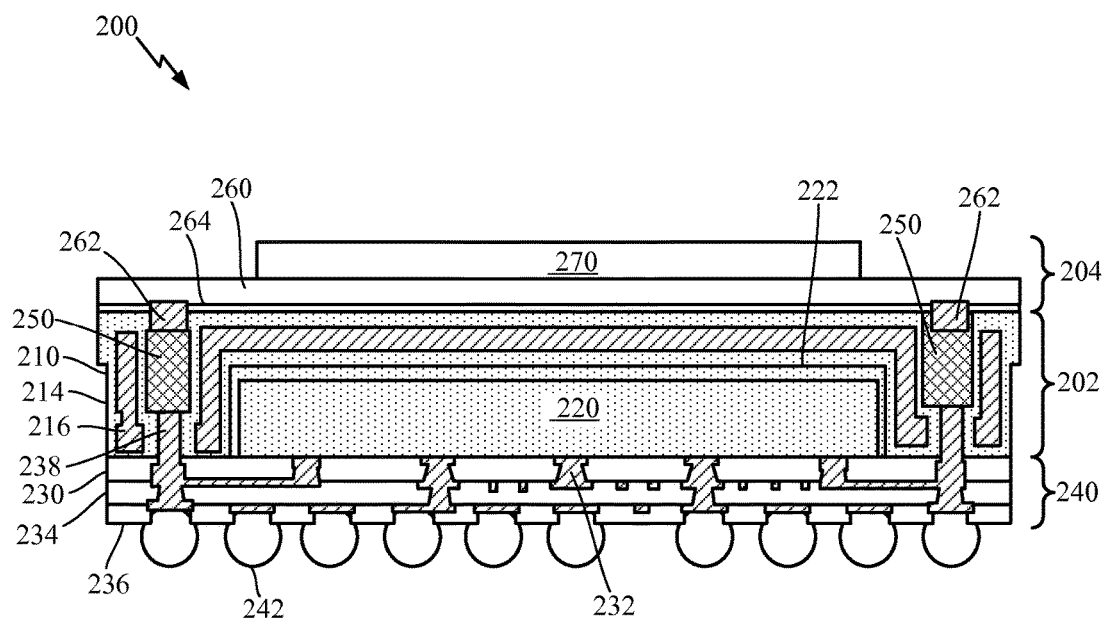
FIG. 2 generally illustrates a PoP semiconductor device package in accordance with an aspect of the disclosure.

FIG. 2 generally illustrates a PoP semiconductor package 200 according to an aspect of the invention. The PoP semiconductor package 200 comprises a first semiconductor package 202 and a second semiconductor package 204. In one possible scenario, the first semiconductor package 202 is a bottom package in the PoP structure of PoP semiconductor package 200 and the second semiconductor package 204 is a top package in the PoP structure of PoP semiconductor package 200.

The first semiconductor package 202 comprises a first semiconductor device 220 and the second semiconductor package 204 comprises a second semiconductor device 270. The first semiconductor device 220 and second semiconductor device 270, respectively may be, for example, an integrated circuit (IC), a processor IC, a memory IC, a die, a chip, a system on a chip (SoC), a mobile station Modem™ (MSM™), or the like. In one possible scenario, the first semiconductor device 220 is a processor IC and the second semiconductor device 270 is a memory IC.

The first semiconductor package 202 further comprises a anodized metal lid structure 210. In the illustration of FIG. 2, the anodized metal lid structure 210 comprises an anodized layer 214 and a metal layer 216. In one possible scenario, the anodized layer 214 covers the entire external surface of anodized metal lid structure 210 and the metal layer 216 lies beneath the anodized layer 214. Because the anodized layer 214 is anodized, it is insulative and non-conductive. In other words, a charge-carrying component that contacts the anodized layer 214 will not transfer charge to or through the anodized layer 214. In the scenario in which the anodized layer 214 covers the entire external surface of the anodized metal lid structure 210, it will be understood that the anodized metal lid structure 210 will not transfer charge with or through adjacent components.

As noted above, the anodized layer 214 may be a thin layer that covers the entire external surface of anodized metal lid structure 210. However, it will be understood that anodized layer 214 may cover less than the entirety of the external surface of anodized metal lid structure 210. Moreover, it will be understood that anodized layer 214 may be a relatively thick layer, and that the metal layer 216 beneath the anodized layer 214 may be relatively thin by comparison. In yet another possible scenario, the metal layer 216 is omitted entirely and anodized metal lid structure 210 is wholly anodized.

The anodized metal lid structure 210 may serve to electrically isolate, support, and protect the first semiconductor device 220. The anodized metal lid structure 210 is an example of a means for electrically isolating and protecting the first semiconductor package 202. As will be described in greater detail with reference to FIGS. 4A-4M, the first semiconductor device 220 may be located in a central cavity formed in the anodized metal lid structure 210. The first semiconductor device 220 may be bonded to the anodized metal lid structure 210 using a first bonding agent 222. The anodized metal lid structure 210 may also comprise vias 238 formed in the anodized metal lid structure 210 for electrical coupling through the anodized metal lid structure 210. The vias 238 may permit the transfer of charge from the second semiconductor package 204 to a redistribution layer 240 located on an opposite side of the anodized metal lid structure 210. For example, the vias 238 may permit transfer of charge from a conductive trace 232 in the first redistribution sub-layer 230 through the anodized metal lid structure 210 and into the solder material 250, as illustrated in FIG. 2.

The redistribution layer 240, as illustrated in FIG. 2, comprises three sub-layers. A first redistribution sub-layer 230 is arranged adjacent to the anodized metal lid structure 210 and the first semiconductor device 220. The first redistribution sub-layer 230 comprises conductive traces 232 which may electrically couple one or more vias 238 to one or more electrical contacts of the first semiconductor device 220. The conductive traces 232 may also electrically couple a plurality of vias 238 to one another and/or a plurality of electrical contacts of the first semiconductor device 220 to one another. The conductive traces 232 may also be formed in a second redistribution sub-layer 234 adjacent to the first redistribution sub-layer 230, and may also be formed in a third redistribution sub-layer 236 adjacent to the second redistribution sub-layer 234. It will be understood that the redistribution layer 240 may comprise more than three sub-layers or fewer than three sub-layer, as required by design considerations.

The redistribution layer 240 is electrically coupled to one or more solder balls 242. The solder balls 242 may couple the PoP semiconductor package 200 to a circuit board (not shown), for example, a printed circuit board. The solder balls 242 may be arranged in a ball grid array (BGA) 122. The solder balls 242 transfer charge between the redistribution layer 240 and the circuit board. As illustrated in FIG. 2, the solder balls 242 are coupled to conductive traces 232 which are formed in the third redistribution sub-layer 236. However, as noted above, the redistribution layer 240 may comprise more than three sub-layers or fewer than three sub-layers, as required by design considerations. The solder balls 242 may be formed on any sub-layer of the redistribution layer 240 to which the circuit board is coupled. In one possible scenario, the circuit board delivers signals and/or power to at least one solder ball 242. The redistribution layer 240 distributes signals and/or power from the at least one solder ball 242 the first semiconductor device 220 and/or one or more of the vias 238.

As noted above, the redistribution layer 240 transfers charge through the vias 238 formed in the anodized metal lid structure 210. The charge may be transferred to a second package substrate 260 included in the second semiconductor package 204. The second package substrate 260 comprises one or more conductive posts 262 which are electrically coupled to the vias 238 via solder material 250. In one stage of the manufacturing process, the solder material 250 may comprise, for example, solder paste and/or silver paste. In one possible scenario, the conductive posts 262 extend from the second package substrate 260 and are inserted into the solder material 250. As will be described in greater detail with reference to FIGS. 4A-4M, the solder material 250 may fill at least a portion of one or more perimeter cavities. In one possible scenario, each of the conductive posts 262 is inserted into a corresponding perimeter cavity containing solder material 250.

The second package substrate 260 may be bonded to the anodized metal lid structure 210 using a second bonding agent 264. The second semiconductor device 270 is coupled to the second package substrate 260. In one possible scenario, the second semiconductor device 270 is embedded in a mold which isolates, supports, and/or protects the second semiconductor device 270. The mold may be coupled to the second package substrate 260 and the second semiconductor device 270. The mold may be, for example, a molded underfill (MUF) or an epoxy mold compound (EMC). In another possible scenario, as shown in FIG. 2, the mold may be omitted.

Figure 1:
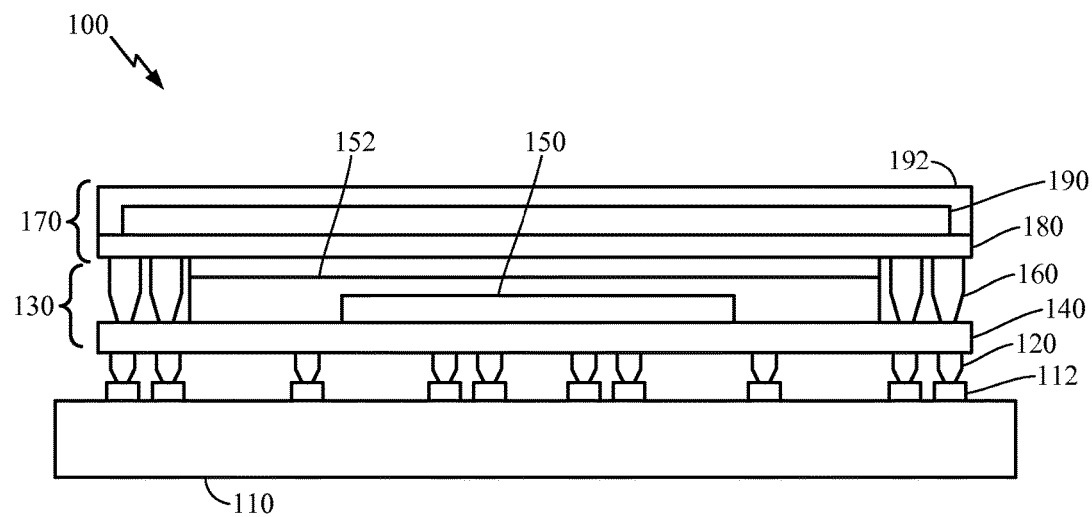
FIG. 1 generally illustrates a conventional PoP semiconductor device package.

In accordance with one aspect of the disclosure, the anodized metal lid structure 210 is better suited for isolating, supporting, and/or protecting the first semiconductor device 220 in comparison to conventional components (e.g., the first substrate 140 illustrated in FIG. 1). In accordance with another aspect of the disclosure, the anodized metal lid structure 210 can be fabricated more easily and more reliably than conventional components (e.g., the first substrate 140 illustrated in FIG. 1). In accordance with yet another aspect of the disclosure, the PoP semiconductor package 200 has increased density in comparison to conventional PoP structures (e.g., the PoP semiconductor device package 100 illustrated in FIG. 1). For example, the arrangement of solder material 250 within perimeter cavities of the anodized metal lid structure 210, and the placement of complementary conductive posts 262 which extend from the second package substrate 260 into the solder material 250, may enable production of a PoP semiconductor package 200 with reduced profile on the order of, for example, approximately 600 μm to 800 μm. By comparison, the use of conventional components (e.g., the solder balls 160 used to couple the first substrate 140 to the second substrate 180 as illustrated in FIG. 1) may result in an increased package profile with reduced density.

Figure 3:
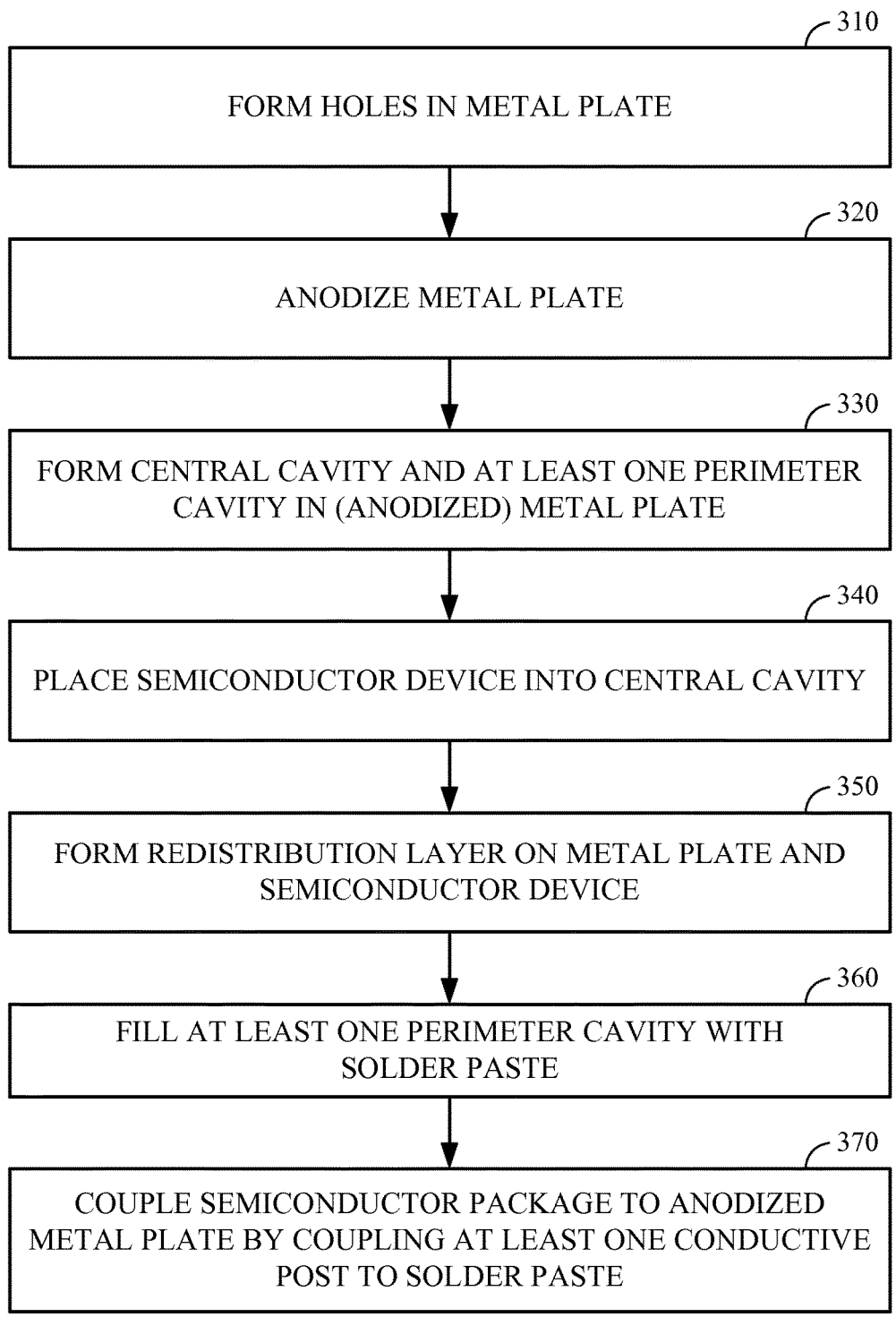
FIG. 3 generally illustrates an exemplary fabrication process in accordance with an aspect of the disclosure.

FIG. 3 generally illustrates an exemplary method 300 for fabricating a semiconductor package. The semiconductor package fabricated in method 300 may be similar to the PoP semiconductor package 200 disclosed in FIG. 2. At 310, holes are formed in a metal plate by, for example, cutting or puncturing the metal plate. At 320, the metal plate is anodized. At 330, a central cavity and at least one perimeter cavity are formed in the metal plate. The central cavity may have a central cavity opening direction which is opposite the perimeter cavity opening direction of the at least one perimeter cavity. It will be understood that 310, 320, and 330 may be completed in any order. After 310, 320, and 330 are completed, the metal plate may be transformed into an anodized metal lid structure similar to anodized metal lid structure 210.

At 340, a semiconductor device is placed into the central cavity which was formed at 330. The semiconductor device may be similar to first semiconductor device 220. At 350, a redistribution layer is formed on the anodized metal lid structure formed at 310, 320, and 330, and the semiconductor device placed into the central cavity at 340. The redistribution layer may be similar to the redistribution layer 240 illustrated in FIG. 2. In one possible example, the redistribution layer 240 is formed on the anodized metal lid structure 210 and first semiconductor device 220 illustrated in FIG. 2.

At 360, the at least one perimeter cavity is at least partially filled with solder material. The solder material may be similar to the solder material 250 illustrated in FIG. 2. At 370, a semiconductor package is coupled to the anodized metal lid structure. In one possible example, the semiconductor package and the anodized metal lid structure are similar to the second semiconductor package 204 and the anodized metal lid structure 210 illustrated in FIG. 2. In one possible scenario, at least one conductive post included in the semiconductor package is inserted into the solder material 250 (e.g., the 350 illustrated in FIG. 2).

FIGS. 4A through 4M generally illustrate an arrangement of components at various stages of a fabrication process. The fabrication process may be used to fabricate the PoP semiconductor package 200 illustrated in FIG. 2. The various stages of the fabrication process illustrated in FIGS. 4A-4M may correspond to one or more of the blocks depicted in the exemplary method 300 illustrated in FIG. 3.

Figure 4A:
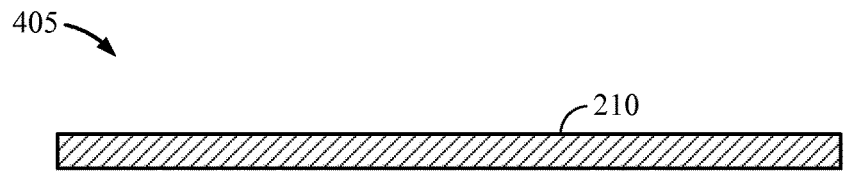
FIG. 4A generally illustrates a schematic diagram of an exemplary arrangement of components in a stage of the fabrication process of FIG. 3.

FIG. 4A generally illustrates an arrangement of components at a first stage first stage 405. In the first stage first stage 405, the anodized metal lid structure 210 begins as a flat sheet of metal. FIG. 4A shows the flat sheet of metal in cross-section. The size, shape and proportions of the flat sheet of metal may be modified as necessary in accordance with design considerations.

Figure 4B:
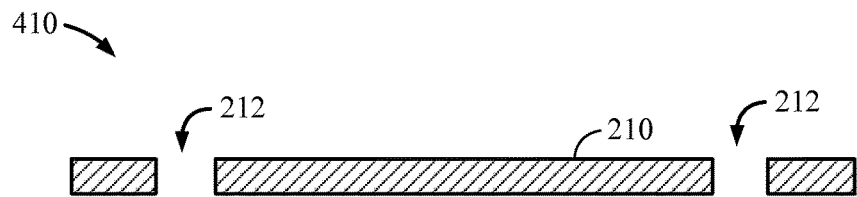
FIG. 4B generally illustrates a schematic diagram of an exemplary arrangement of components in another stage of the fabrication process of FIG. 3.

FIG. 4B generally illustrates an arrangement of components at a second stage 410. In the second stage 410, holes 212 are formed in the flat sheet of metal from the first stage 405. The size, shape and proportions of the holes 212 may be modified as necessary in accordance with design considerations. In the design of FIG. 2, for example, the holes 212 are of suitable size, shape, and proportion to accommodate the vias 238 which are necessary for proper utilization of the anodized metal lid structure 210. The holes 212 may be formed by cutting, puncturing, or any other suitable process.

Figure 4C:
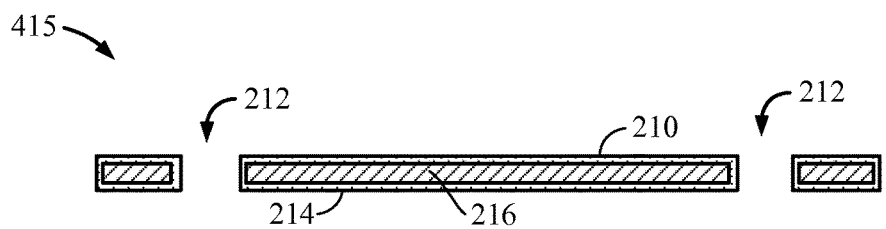
FIG. 4C generally illustrates a schematic diagram of an exemplary arrangement of components in yet another stage of the fabrication process of FIG. 3.

FIG. 4C generally illustrates an arrangement of components at a third stage 415. In the third stage 415, the flat sheet of metal from the second stage 410 is anodized. As a result of the anodization, an anodized layer 214 is formed on the external surface of the anodized metal lid structure 210. Unexposed portions of the anodized metal lid structure 210 may not be anodized. As a result, a metal layer 216 may remain beneath the surface of the anodized layer 214. Because the anodized metal lid structure 210 is made of metal, it may resist warping throughout each of the stages illustrated in FIGS. 4A-4M. The anodized metal lid structure 210 may also be more suitable for support and protection of other components (e.g., a first semiconductor device 220). Because the anodized layer 214 is anodized, the anodized metal lid structure 210 will not conduct electricity. The anodized metal lid structure 210 will therefore remain suitable for electrical isolation of adjacent components. The anodized metal lid structure 210 may include any suitable material, for example, copper, aluminum, alloys that include copper and/or aluminum, etc.

Figure 4D:
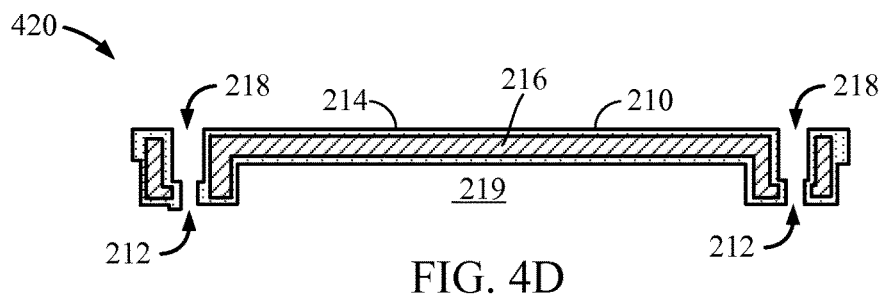
FIG. 4D generally illustrates a schematic diagram of an exemplary arrangement of components in yet another stage of the fabrication process of FIG. 3.

FIG. 4D generally illustrates an arrangement of components at a fourth stage 420. In the fourth stage 420, the anodized metal lid structure 210 is shaped to form at least one perimeter cavity 218 and at least one central cavity 219. In FIG. 4D, two perimeter cavities 218 and one central cavity 219 are shown, but it will be appreciated that any number of perimeter cavities 218 and any number of central cavities 219 may be included. In one possible scenario, each perimeter cavity 218 corresponds to an individual hole 212.

As shown in FIG. 4D, the central cavity 219 is formed such that the central cavity 219 has an opening direction facing downward. (It will be understood that "downward" and "upward" are illustrative terms and that during the disclosed process, the opening direction may comprise any suitable direction in accordance with fabrication considerations.) The perimeter cavities 218 are formed with an opening direction facing upward, that is, in an opposite direction as the opening direction of the central cavity 219.

It will be understood that the respective perimeter cavity 218 and central cavity 219 may have any three-dimensional shape, e.g., cylindrical, cubic, rectangular, etc. For example, in the design illustrated in FIG. 2, the central cavity 219 may be designed so as to accommodate a first semiconductor device 220 having a flattened six-sided rectangular structure wherein the height of the first semiconductor device 220 is small relative to the length and width. (It will be understood that "length", "width" and "height" are illustrative terms and that, for illustrative purposes, "height" corresponds to the "upward" and "downward" directions, as illustrated in FIG. 4D.) According to this example, the central cavity 219 may be designed such that it corresponds to the flattened, six-sided first semiconductor device 220. In one possible scenario, the central cavity 219 has five sides—a first side corresponding to the width and length of the first semiconductor device 220, and four sides extending from the first side in a downward direction. According to this example, the absent sixth side of the central cavity 219, facing downward in FIG. 4D, would correspond to the opening direction of the central cavity 219.

In another example of the design illustrated in FIG. 2, the perimeter cavity 218 may be designed so as to accommodate a conductive post 262 and a certain volume of solder material 250. For example, in the design illustrated in FIG. 2, the perimeter cavity 218 may be designed so as to accommodate a conductive post 262 having a cylindrical structure wherein the height of the conductive post 262 is large relative to the radius. According to this example, the perimeter cavity 218 may be designed such that is corresponds to the cylindrical conductive post 262. In one possible scenario, the perimeter cavity 218 has a base in which the hole 212 is formed and an absent top corresponding to the opening direction of the perimeter cavity 218. The volume of the perimeter cavity may be sufficient to accommodate the conductive post 262 and a predetermined volume of solder material 250.

In other possible scenarios, the central cavity 219 may be designed to accommodate the first semiconductor device 220 in addition to a complementary device. Additionally or alternatively, multiple central cavities may be formed, each accommodating one or more devices. Moreover, the perimeter cavity 218 may be designed to accommodate multiple conductive posts 262 and/or other components.

Any suitable process may be utilized to form the one or more perimeter cavities 218 and one or more central cavities 219 in the anodized metal lid structure 210. For example, the anodized metal lid structure 210 may be folded, bent, punched, or pressed against a mold.

It will be understood that the anodized metal lid structure 210 illustrated in FIG. 4D may be formed by any suitable process in accordance with aspects of the disclosure. The anodized metal lid structure 210 may be formed by first forming holes 212, by next anodizing the metal to form the anodized layer 214, and by finally forming the perimeter cavities 218 and central cavities 219. FIGS. 4B to 4D illustrate this particular order of events. However, it will be understood that anodized metal lid structure 210 anodization may be performed before forming the holes, or alternatively, after forming the cavities. In another possible scenario, the perimeter cavities 218 and central cavities 219 are formed through distinct operations. In yet another possible scenario, the holes 212, the perimeter cavities 218, and central cavities 219 are each formed in a single operation, either before, after, and/or simultaneously with anodization.

Figure 4E:
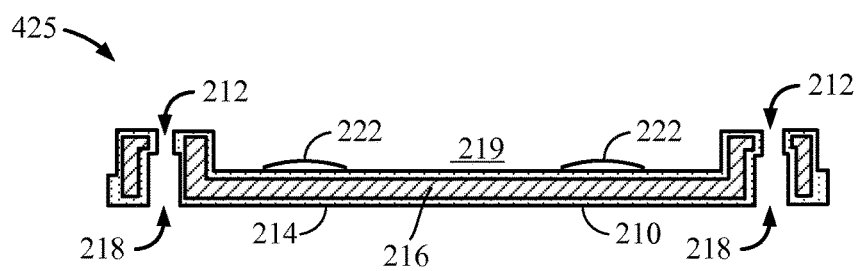
FIG. 4E generally illustrates a schematic diagram of an exemplary arrangement of components in yet another stage of the fabrication process of FIG. 3.

FIG. 4E generally illustrates an arrangement of components at a fifth stage 425. In the fifth stage 425, a first bonding agent 222 is provided to the central cavity 219 of the anodized metal lid structure 210. Although FIG. 4E shows the anodized metal lid structure 210 in a "flipped" state, such that the opening direction of the central cavity 219 is in an upward direction, it will be understood that the orientation of the various components in FIGS. 4A-4M is shown merely for illustrative purposes.

Figure 4F:
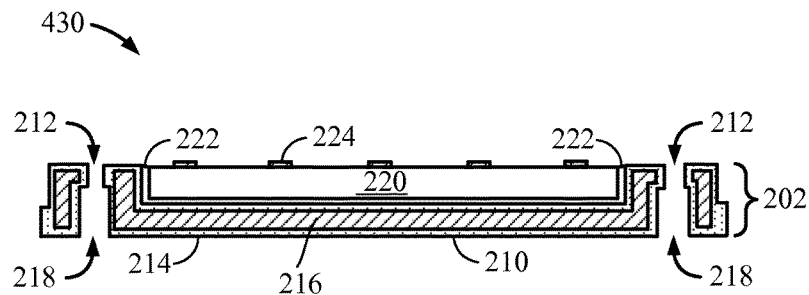
FIG. 4F generally illustrates a schematic diagram of an exemplary arrangement of components in yet another stage of the fabrication process of FIG. 3.

FIG. 4F generally illustrates an arrangement of components at a sixth stage 430. In the sixth stage 430, a semiconductor device, e.g., first semiconductor device 220, is placed into the central cavity 219 formed in the fourth stage 420. In one possible scenario, the arrangement of components shown in FIG. 4F includes a semiconductor package, e.g., the first semiconductor package 202 illustrated in FIG. 2. The first semiconductor device 220 has electrical contacts 224 formed thereon. After the first semiconductor device 220 is placed, the side of the first semiconductor device 220 on which the electrical contacts 224 are formed corresponds to the opening direction of the central cavity 219. The first bonding agent 222 provided to the central cavity 219 in the fifth stage 425 is used to bond the first semiconductor device 220 to the anodized metal lid structure 210. In another aspect of the disclosure, the first bonding agent 222 is omitted and the first semiconductor device 220 is press-fitted to the central cavity 219. The first bonding agent 222 may comprise any suitable material, e.g., adhesive, resin, mold, etc.

Figure 4G:
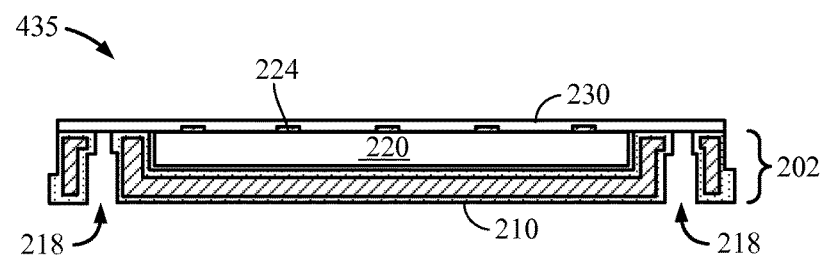
FIG. 4G generally illustrates a schematic diagram of an exemplary arrangement of components in yet another stage of the fabrication process of FIG. 3.

FIG. 4G generally illustrates an arrangement of components at a seventh stage 435. In the seventh stage 435, a first sub-layer of a redistribution layer, e.g., the first redistribution sub-layer 230 of the redistribution layer 240 illustrated in FIG. 2, is formed over the electrical contacts 224 and holes 212.

Figure 4H:
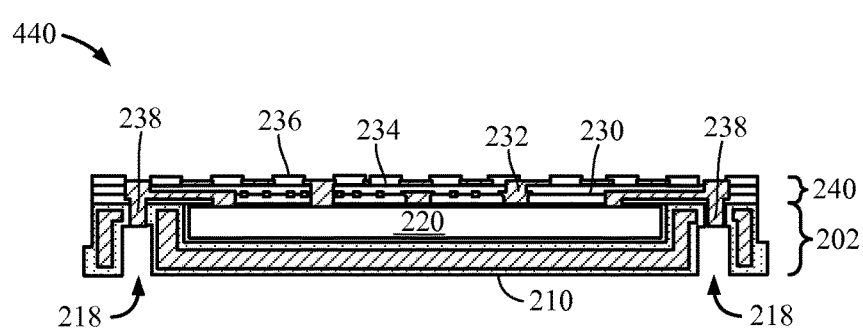
FIG. 4H generally illustrates a schematic diagram of an exemplary arrangement of components in yet another stage of the fabrication process of FIG. 3.

FIG. 4H generally illustrates an arrangement of components at an eighth stage 440. In the eighth stage 440, a redistribution layer, e.g., the redistribution layer 240 illustrated in FIG. 2, is formed from the first redistribution sub-layer 230. Once the first redistribution sub-layer 230 is formed over the electrical contacts 224 and holes 212 in the seventh stage 435, conductive traces 232 are formed in the first redistribution sub-layer 230. The conductive traces 232 may be formed using any suitable technique, for example, a photo-lithography technique. The conductive traces 232 may include vias 238 formed by at least partially filling the holes 212 with conductive materials. Alternatively, the conductive traces 232 and vias 238 may be formed in separate stages. One or more of the conductive traces 232 and/or vias 238 may be exposed to at least one perimeter cavity 218. The conductive material forming the conductive traces 232 and/or vias 238 may entirely or partially fill the one or more holes 212. Alternatively, the conductive traces 232 and/or vias 238 may reside outside of the one or more holes 212.

The remaining layers of the redistribution layer 240, e.g., the second redistribution sub-layer 234 and the third redistribution sub-layer 236, may be fabricated using similar techniques. The conductive traces 232 may have branches that extend through each sub-layer of the redistribution layer 240 in accordance with design considerations. The redistribution layer 240 is an example of a means for redistributing electrical signals.

Figure 4I:
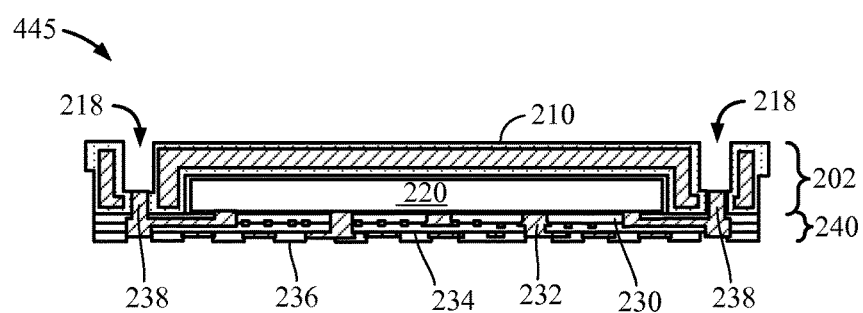
FIG. 4I generally illustrates a schematic diagram of an exemplary arrangement of components in yet another stage of the fabrication process of FIG. 3.

FIG. 4I generally illustrates an arrangement of components at a ninth stage 445. The arrangement of components at the ninth stage 445 is the same as the arrangement shown in FIG. 4H, except that the components are illustrated in a "flipped" state, such that the opening direction of the perimeter cavities 218 is in an upward direction. It will be understood that the orientation of the various components in FIGS. 4A-4M is shown merely for illustrative purposes.

Figure 4J:
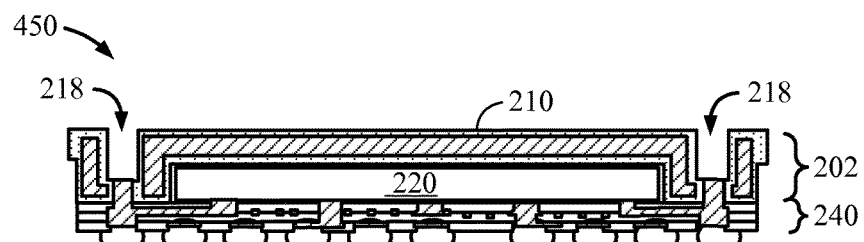
FIG. 4J generally illustrates a schematic diagram of an exemplary arrangement of components in yet another stage of the fabrication process of FIG. 3.

FIG. 4J generally illustrates an arrangement of components at a tenth stage 450. At the tenth stage 450, one or more solder balls, e.g., the solder balls 242 illustrated in FIG. 2, are formed on the redistribution layer 240. The solder balls 242 may facilitate the coupling of the PoP semiconductor package 200 to, for example, a circuit board (not shown).

Figure 4K:
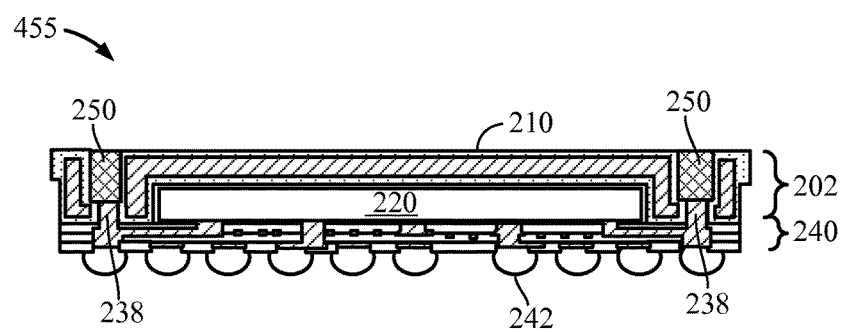
FIG. 4K generally illustrates a schematic diagram of an exemplary arrangement of components in yet another stage of the fabrication process of FIG. 3.

FIG. 4K generally illustrates an arrangement of components at an eleventh stage 455. At the eleventh stage 455, at least one of the perimeter cavities 218 is at least partially filled with solder material, e.g., the solder material 250 illustrated in FIG. 2. Upon the filling of at least one perimeter cavity 218 at the eleventh stage 455, the solder material 250 will be electrically coupled to the conductive traces 232 and/or vias 238. The solder material 250 may entirely or partially fill the one or more holes 212. Alternatively, the solder material 250 may reside outside of the one or more holes 212. The solder material 250 is an example of first means for coupling.

Figure 4L:
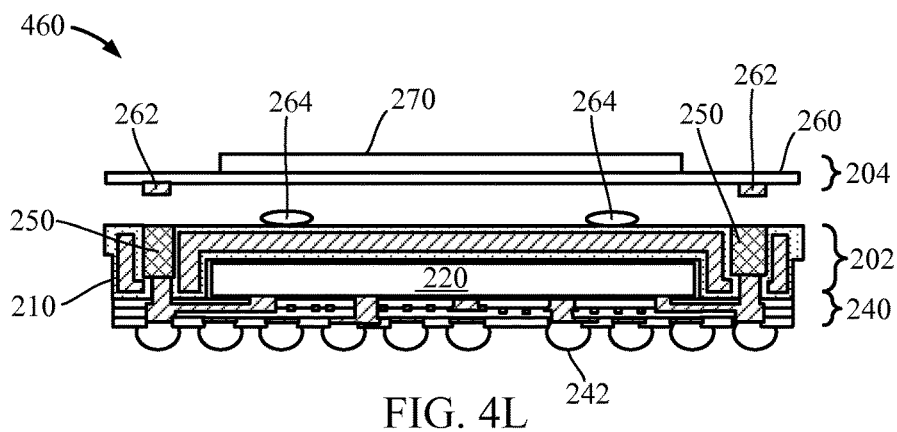
FIG. 4L generally illustrates a schematic diagram of an exemplary arrangement of components in yet another stage of the fabrication process of FIG. 3.

FIG. 4L generally illustrates an arrangement of components at a twelfth stage 460. At the twelfth stage 460, bonding agent, e.g., the second bonding agent 264 illustrated in FIG. 2, is provided to the surface of the anodized metal lid structure 210. The second bonding agent 264 is used to bond the first semiconductor package 202 to another semiconductor package, e.g., the second semiconductor package 204 illustrated in FIG. 2. In particular, the second bonding agent 264 bonds the surface of the anodized metal lid structure 210 to a surface of a substrate included in the second semiconductor package 204, e.g., the second package substrate 260. The second package substrate 260 supports a semiconductor die, e.g., the second semiconductor device 270 illustrated in FIG. 2. The second package substrate 260 also comprises conductive posts 262 formed thereon. In one possible scenario, the conductive posts 262 extend downward from a bottom surface of the second package substrate 260. The conductive posts 262 are an example of second means for coupling.

Figure 4M:
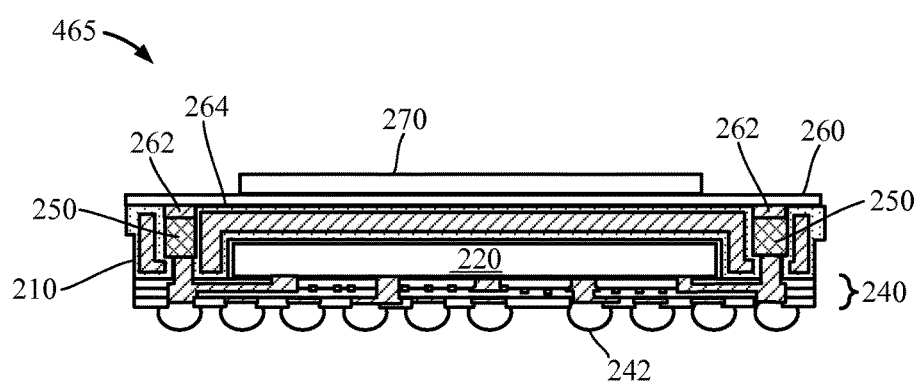
FIG. 4M generally illustrates a schematic diagram of an exemplary arrangement of components in yet another stage of the fabrication process of FIG. 3.

FIG. 4M generally illustrates an arrangement of components at a thirteenth stage 465. At the thirteenth stage 465, the second semiconductor package 204 is coupled to the first semiconductor package 202 in accordance with any suitable process, e.g., compression or press-fitting. In one possible scenario, each of the conductive posts 262 formed on the second semiconductor package 204 corresponds to a hole 218 which is at least partially filled with the solder material 250.

Figure 5:
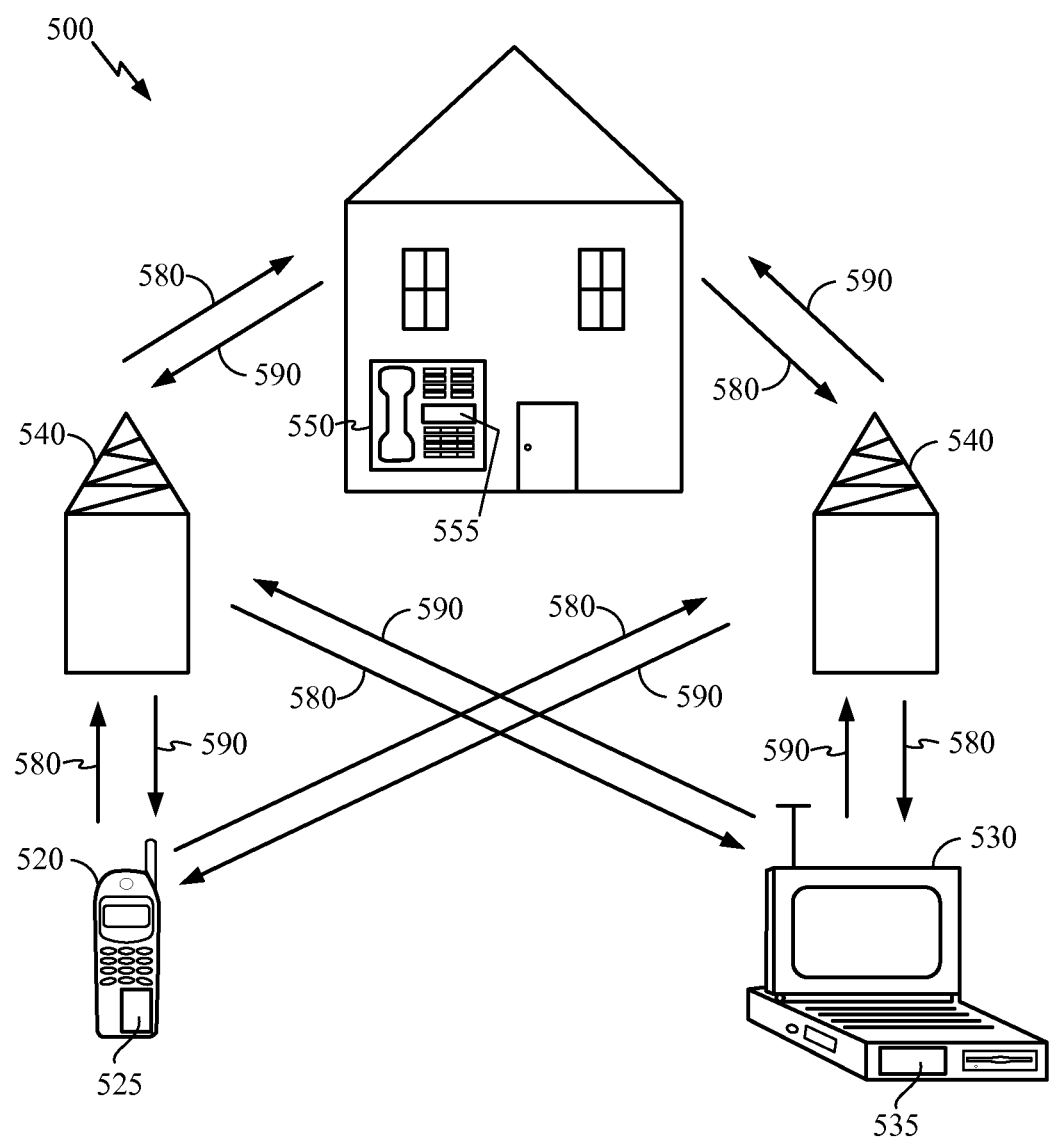
FIG. 5 generally illustrates a block diagram showing an exemplary wireless communication system in which an aspect of the disclosure may be advantageously employed.

FIG. 5 is a block diagram showing an exemplary wireless communication system 500 in which an aspect of the disclosure may be advantageously employed. For purposes of illustration, FIG. 5 shows three remote units 520, 530, and 550 and two base stations 540. It will be recognized that wireless communication systems may have many more remote units and base stations. Remote units 520, 530, and 550 include IC devices 525, 535 and 555, as disclosed below. It will be recognized that any device containing an IC may also include semiconductor components having the disclosed features and/or components manufactured by the processes disclosed here, including the base stations, switching devices, and network equipment. FIG. 5 shows forward link signals 580 from the base station 540 to the remote units 520, 530, and 550 and reverse link signals 590 from the remote units 520, 530, and 550 to base stations 540.

In FIG. 5, the remote unit 520 is shown as a mobile telephone, the remote unit 530 is shown as a portable computer, and the remote unit 550 is shown as a fixed location remote unit in a wireless local loop system. For example, the remote units may be a device such as a music player, a video player, an entertainment unit, a navigation device, a communications device, a personal digital assistant (PDA), a fixed location data unit, and a computer. Although FIG. 5 illustrates remote units according to the teachings of the disclosure, the disclosure is not limited to these exemplary illustrated units. The disclosure may be suitably employed in any device which includes semiconductor components, as described below.

The semiconductor packages disclosed herein (e.g., semiconductor package PoP semiconductor package 200, etc.) may be included in a device such as a set top box, a music player, a video player, an entertainment unit, a navigation device, a communications device, a personal digital assistant (PDA), a fixed location data unit, or a computer.

Figure 6:
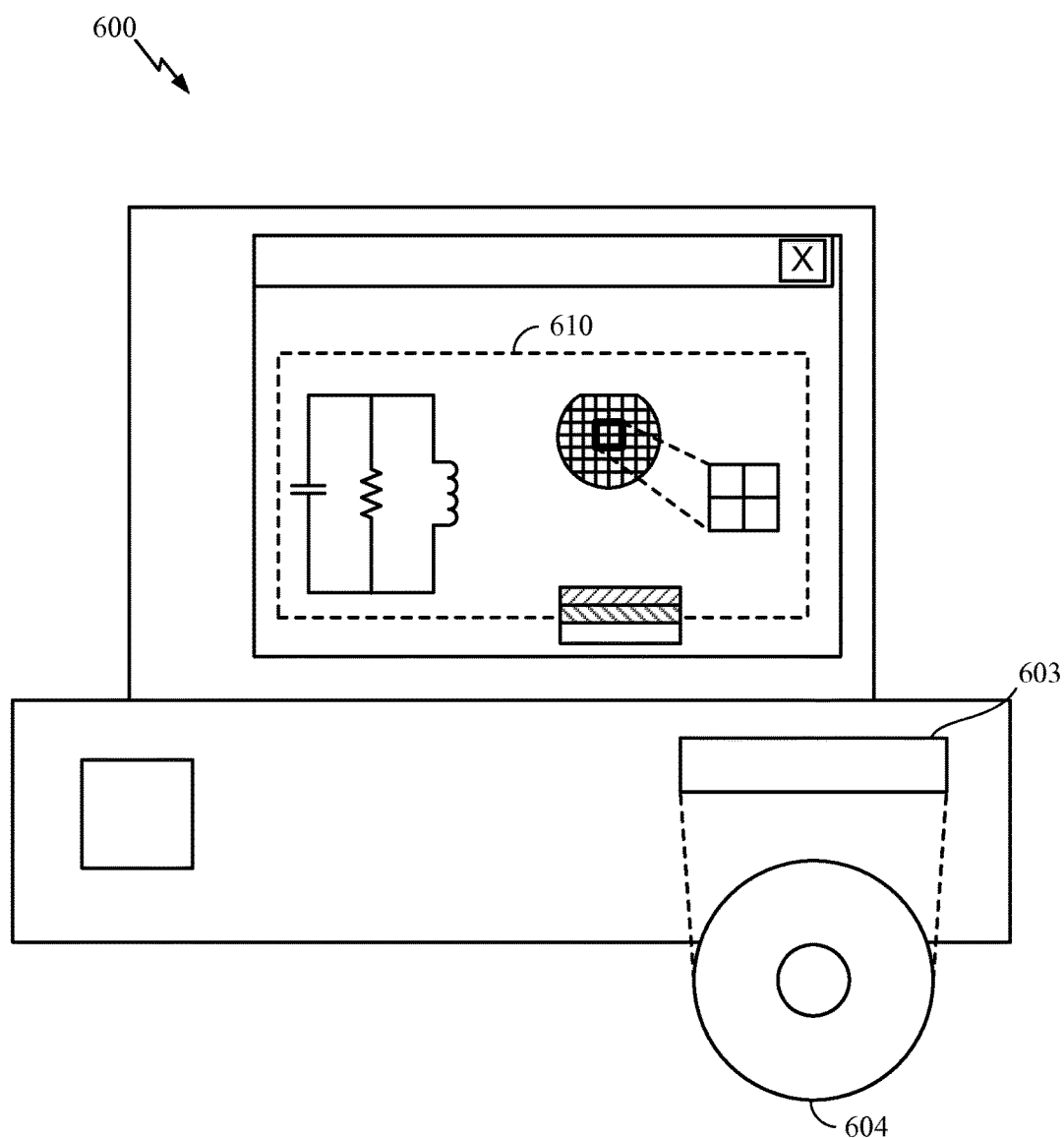
FIG. 6 generally illustrates a block diagram illustrating a design workstation used for circuit, layout, and logic design of the disclosed semiconductor IC package.

FIG. 6 is a block diagram illustrating a design workstation for circuit, layout, and design of a semiconductor part as disclosed herein. A design workstation 600 may include a hard disk 601 containing operating system software, support files, and design software such as Cadence or OrCAD. The design workstation 600 also includes a display to facilitate design of a semiconductor part 610 that may include a circuit and semiconductor dies. A storage medium 604 is provided for tangibly storing the semiconductor part 610. The semiconductor part 610 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. Providing data on the storage medium 604 facilitates the design of the semiconductor part 610 by decreasing the number of processes for designing circuits and semiconductor dies.

The foregoing description may have references to discrete elements or properties, such as a capacitor, capacitive, a resistor, resistive, an inductor, inductive, conductor, conductive and the like. However, it will be appreciated that the various aspects disclosed herein are not limited to specific elements and that various components, elements or portions of components or elements may be used to achieve the functionality of one or more discrete elements or properties. For example, a capacitive component or capacitive element may be a discrete device or may be formed by a specific arrangement of conductive traces separated by a dielectric material or combinations of thereof. Likewise, an inductive component or inductive element may be a discrete device or may be formed by a specific arrangement of conductive traces and materials (e.g., air core, magnetic, paramagnetic, etc.) or combinations of thereof. Similarly, a resistive component or resistive element may be a discrete device or may be formed by a semiconductor material, insulating material, adjusting the length and/or cross-sectional area of conductive traces, or combinations of thereof. Moreover, a specific arrangement of conductive traces and materials may provide one or more resistive, capacitive or inductive functions. Accordingly, it will be appreciated that the various components or elements disclosed herein are not limited to the specific aspects and or arrangements detailed, which are provided merely as illustrative examples.

While the foregoing disclosure shows illustrative aspects of the disclosure, it should be noted that various changes and modifications could be made herein without departing from the scope of the invention as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A package-on-package (PoP) semiconductor device, comprising:
   a first semiconductor package, the first semiconductor package comprising:
      an anodized metal lid structure comprising one or more horizontal portions and one or more vertical portions, the anodized metal lid structure comprising (i) a central cavity comprising a central cavity opening direction and (ii) at least one perimeter cavity comprising a perimeter cavity opening direction facing in an opposite direction of the central cavity opening direction, wherein the central cavity is separated from the at least one perimeter cavity by the one or more vertical portions;
      a first semiconductor device arranged in the central cavity of the anodized metal lid structure;
      a redistribution layer configured to electrically couple to the first semiconductor device, wherein a conductive trace formed in the redistribution layer is exposed to the at least one perimeter cavity; and
      solder material arranged in the at least one perimeter cavity; and
   a second semiconductor package, the second semiconductor package comprising at least one conductive post, wherein the at least one conductive post is configured to electrically couple to the solder material arranged in the at least one perimeter cavity, wherein the central cavity is separated from the second semiconductor package by the one or more horizontal portions.

2. The PoP semiconductor device of claim 1, wherein the anodized metal lid structure further comprises holes configured to accommodate the transfer of charge from the conductive trace formed in the redistribution layer to the solder material.

3. The PoP semiconductor device of claim 1, wherein the first semiconductor device is bonded to a surface of the central cavity with a first bonding agent.

4. The PoP semiconductor device of claim 1, wherein the redistribution layer is a photo-lithographic redistribution layer.

5. The PoP semiconductor device of claim 1, further comprising solder balls coupled to the redistribution layer on a side of the redistribution layer which is opposite the side of the redistribution layer to which the first semiconductor device is configured to be electrically coupled.

6. The PoP semiconductor device of claim 1, wherein the second semiconductor package is bonded to the first semiconductor package with a second bonding agent.

7. The PoP semiconductor device of claim 6, wherein the second semiconductor package is compression bonded to the first semiconductor package.

8. The PoP semiconductor device of claim 6, wherein a second semiconductor device of the second semiconductor package is electrically coupled to the first semiconductor device of the first semiconductor package via the at least one conductive post and the solder material.

9. The PoP semiconductor device of claim 1, wherein the PoP semiconductor device has a height of approximately 600 μm to 800 μm.

10. A device selected from the group consisting of a set top box, a music player, a video player, an entertainment unit, a navigation device, a communications device, a personal digital assistant (PDA), a fixed location data unit, and a computer, including the PoP semiconductor device of claim 1.

11. A method of fabricating a package-on-package (PoP) semiconductor device, comprising:
    forming an anodized metal lid structure comprising one or more horizontal portions and one or more vertical portions, wherein forming the anodized metal lid structure comprises:
        defining a central cavity comprising a central cavity opening direction in the anodized metal lid structure; and
        defining at least one perimeter cavity comprising a perimeter cavity opening direction in the anodized metal lid structure, wherein the perimeter cavity opening direction faces in an opposite direction of the central cavity opening direction, and the central cavity is separated from the at least one perimeter cavity by the one or more vertical portions;
    placing a first semiconductor device in the central cavity of the anodized metal lid structure;
    providing a first semiconductor package, wherein providing the first semiconductor package comprises electrically coupling the first semiconductor device to a redistribution layer and forming a conductive trace formed in the redistribution layer such that the conductive trace is exposed to the at least one perimeter cavity;
    filling at least a portion of the at least one perimeter cavity with a solder material; and
    coupling a second semiconductor package comprising at least one conductive post to the first semiconductor package by coupling the at least one conductive post to the solder material, wherein the central cavity is separated from the second semiconductor package by the one or more horizontal portions.

12. The method of claim 11, wherein forming the anodized metal lid structure further comprises:
    forming holes in a metal plate; and
    anodizing the metal plate.

13. The method of claim 11, wherein placing the first semiconductor device in the central cavity comprises bonding the first semiconductor device to the central cavity with a first bonding agent.

14. The method of claim 11, wherein coupling the first semiconductor device to the redistribution layer comprises forming the redistribution layer using photo-lithography techniques.

15. The method of claim 11, further comprising coupling solder balls to the redistribution layer on a side of the redistribution layer which is opposite the side of the redistribution layer to which the first semiconductor device is electrically coupled.

16. The method of claim 11, wherein coupling the second semiconductor package further comprises bonding the second semiconductor package to the first semiconductor package.

17. The method of claim 16, wherein bonding the second semiconductor package to the first semiconductor package comprises compression bonding.

18. The method of claim 16, wherein coupling the at least one conductive post to the solder material comprises electrically coupling a second semiconductor device of the second semiconductor package to the first semiconductor device of the first semiconductor package.

19. The method of claim 11, wherein fabricating the semiconductor device comprises fabricating the PoP semiconductor device having a height of approximately 600 μm to 800 μm.

20. A package-on-package (PoP) semiconductor device, comprising:
    a first semiconductor package, the first semiconductor package comprising:
        means for electrically isolating and protecting the first semiconductor package comprising one or more horizontal portions and one or more vertical portions, further comprising a first opening and a second opening facing in an opposite direction of the first opening, wherein the first opening is separated from the second opening by the one or more vertical portions;
        a first semiconductor device arranged in the first opening of the means for electrically isolating and protecting the first semiconductor package;
        means for redistributing electrical signals configured to electrically couple to the first semiconductor device and exposed to the second opening; and
        first means for coupling arranged in the second opening; and
    a second semiconductor package, the second semiconductor package comprising second means for coupling, wherein the second means for coupling is configured to electrically couple to the first means for coupling arranged in the second opening, wherein the first opening of the means for electrically isolating and protecting the first semiconductor package is separated from the second semiconductor package by the one or more horizontal portions.

21. The PoP semiconductor device of claim 1, wherein the central cavity comprises a plurality of sides, and the plurality of sides of the central cavity are defined by the one or more horizontal portions and the one or more vertical portions, with the one or more horizontal portions being arranged opposite the central cavity opening direction.

22. The PoP semiconductor device of claim 1, wherein defining the central cavity comprises defining a central cavity comprising a plurality of sides, and the plurality of sides of the central cavity are defined by the one or more horizontal portions and the one or more vertical portions, with the one or more horizontal portions being arranged opposite the central cavity opening direction.

23. The PoP semiconductor device of claim 20, wherein the first opening comprises a plurality of sides, and the plurality of sides of the first opening are defined by the one or more horizontal portions and the one or more vertical portions, with the one or more horizontal portions being arranged opposite the first opening.

* * * * *